(12) United States Patent
Lam et al.

(10) Patent No.: US 10,304,759 B2
(45) Date of Patent: May 28, 2019

(54) ELECTRONIC DEVICE AND METHOD OF MAKING SAME

(71) Applicant: Nexperia B.V., Nijmegen (NL)

(72) Inventors: Kan Wae Lam, Kwai Chung (HK); Shun Tik Yeung, Kwai Chung (HK); Pompeo V. Umali, Kwai Chung (HK); Chi Ho Leung, Kwun Tong (HK); Chi Ling Shum, Kwai Chung (HK)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/229,133

(22) Filed: Aug. 5, 2016

(65) Prior Publication Data
US 2017/0053855 A1    Feb. 23, 2017

(30) Foreign Application Priority Data

Aug. 21, 2015   (CN) .......................... 2015 1 0518287

(51) Int. Cl.
*H01L 21/56*    (2006.01)
*H01L 23/31*    (2006.01)
*H01L 23/495*   (2006.01)

(52) U.S. Cl.
CPC ...... *H01L 23/49541* (2013.01); *H01L 21/561* (2013.01); *H01L 23/3107* (2013.01); *H01L 23/49582* (2013.01); *H01L 2224/48247* (2013.01); *H01L 2224/48465* (2013.01); *H01L 2224/49171* (2013.01); *H01L 2224/73265* (2013.01); *H01L 2224/97* (2013.01); *H01L 2924/181* (2013.01)

(58) Field of Classification Search
CPC ......... H01L 21/561; H01L 2224/73265; H01L 2224/48091; H01L 21/78; H01L 24/48
USPC ......................................................... 257/676
See application file for complete search history.

(56) References Cited

U.S. PATENT DOCUMENTS

| | | | |
|---|---|---|---|
| 5,429,992 A | | 7/1995 | Abbott et al. |
| 5,455,455 A | * | 10/1995 | Badehi ................... H01L 23/10 |
| 6,040,235 A | * | 3/2000 | Badehi .................. H01L 21/301 |
| 6,686,652 B1 | | 2/2004 | Bayan et al. |
| 6,872,599 B1 | | 3/2005 | Li et al. |
| 7,075,816 B2 | | 7/2006 | Fee et al. |
| 9,269,690 B2 | * | 2/2016 | Groenhuis ............. H01L 24/67 |
| 2006/0022773 A1 | * | 2/2006 | Iwasaki ............... H01P 1/20345 |
| | | | 333/204 |
| 2006/0117163 A1 | * | 6/2006 | Okuyama ............ H04B 1/0057 |
| | | | 712/1 |
| 2013/0087823 A1 | * | 4/2013 | Tsai ........................ H01L 33/38 |
| | | | 257/98 |
| 2013/0200958 A1 | * | 8/2013 | Satake ................ H03H 7/0123 |
| | | | 333/5 |
| 2016/0126162 A1 | | 5/2016 | Leung et al. |

* cited by examiner

*Primary Examiner* — Andy Huynh
(74) *Attorney, Agent, or Firm* — Ohlandt, Greeley, Ruggiero & Perle, L.L.P.

(57) ABSTRACT

An electronic device has a first surface, a second surface opposite to the first surface, and sidewalls located between and adjoining the first and second surfaces. The electronic device includes contact pads on the first surface. The contact pads extend from the first surface to adjoining sidewalls, and abut the sidewalls.

4 Claims, 11 Drawing Sheets

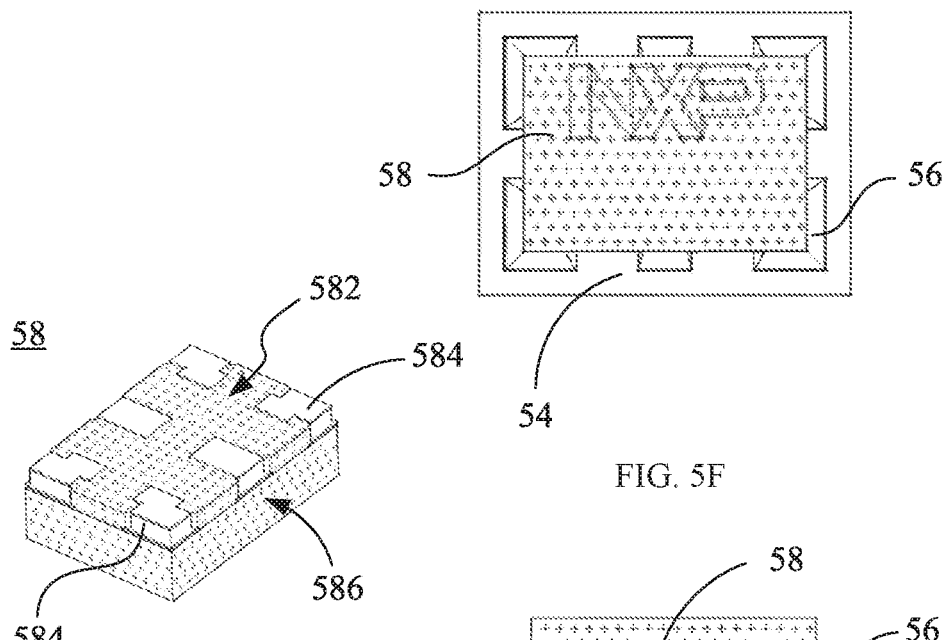
FIG. 5E
FIG. 5F
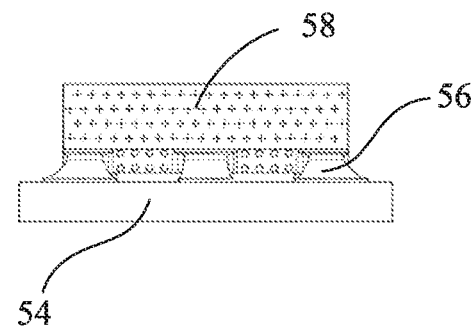
FIG. 5G
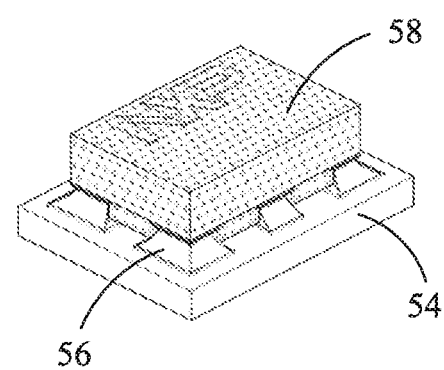
FIG. 5H

US 10,304,759 B2

ELECTRONIC DEVICE AND METHOD OF MAKING SAME

BACKGROUND

The present invention relates to an electronic device and a method of making the electronic device, and, more particularly, to an electronic device with dual-side solderable pads.

Various Small Outline Package (SOP) electronic device structures, for example SON (Small Outline Package, No leads) and QFN (Quad Flat No-lead), have been developed to meet component miniaturization demands of electronic devices. After the electronic devices are assembled, they are attached to external circuitry for operating according to their designed function. Typically, the electronic devices are connected to a printed circuit boards (PCB) through soldering techniques. The reliability of the solder joint has a great impact on the fulfillment of the electronic device's function. Automatic Optical Inspection (AOI) typically is used for checking the PCB after soldering to determine, through profiles of the soldered devices, if there is any rosin joint, tilt, or missing solder.

For QFN packages, the solder pads are located on the surface facing the PCB. After soldering, the welding spots are sandwiched between the PCB and the electronic device such that they are blocked and cannot be seen. When using AOI machines for inspection, the solder features of such QFN packages cannot be captured for determination of solder reliability.

Packaging requirements include improved system level integration, improved electrical performance, heat dissipation, and further miniaturization. Therefore, it would be advantageous to have a small package with good solderability, good heat dissipation and inspectable solder joints.

BRIEF DESCRIPTION OF THE DRAWINGS

The invention may be more completely understood in consideration of the following detailed description of various embodiments of the invention in connection with the accompanying drawings, in which:

FIGS. 5A-5H are structural diagrams illustrating an electronic device and its application in connecting to an external circuit;

DETAILED DESCRIPTION

It is desirable to provide an electronic device with a small outline and that enables automatic optical inspection. It also is desirable to provide a corresponding method for making the electronic device.

The present invention provides an electronic device having a first surface, a second surface opposite to the first surface, and sidewalls between and adjoining the first and second surfaces. The electronic device includes contact pads on the first surface. The contact pads extend from the first surface to the adjoining sidewalls, and abut the sidewalls.

A method of making an electronic device that includes a lead frame and a die electrically connected to the lead frame includes: sealing the lead frame and the die with an encapsulant; first cutting the encapsulation along a first direction to expose a first conductive side of the lead frame; and second cutting the encapsulation along a second direction with a predetermined angle to the first direction to expose a second conductive side of the lead frame. The first conductive side and the second conductive side of the lead frame extend respectively along the first direction and the second direction and abut.

According to embodiments of the invention, the contact pads extend from the first surface to adjoining sidewalls and abut the sidewalls. After the electronic device is connected to external circuitry (like a PCB), solder and flux are applied to the abutting contact pads on adjoining sidewalls, which enables the solder joints to be captured by AOI.

Further, the invention requires no additional frame outside of the lead frame that provides the contact pads. Such a frameless structure reduces device size.

Figure 1A:
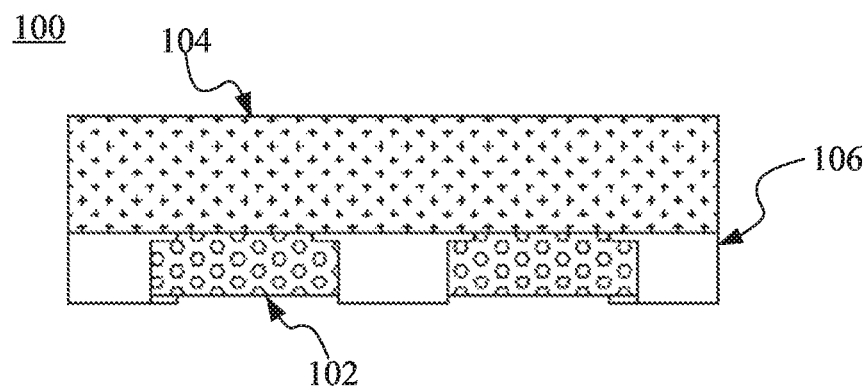
FIGS. 1A and 1B are respectively side view and bottom view of an electronic device according to an embodiment.
Figure 1B:
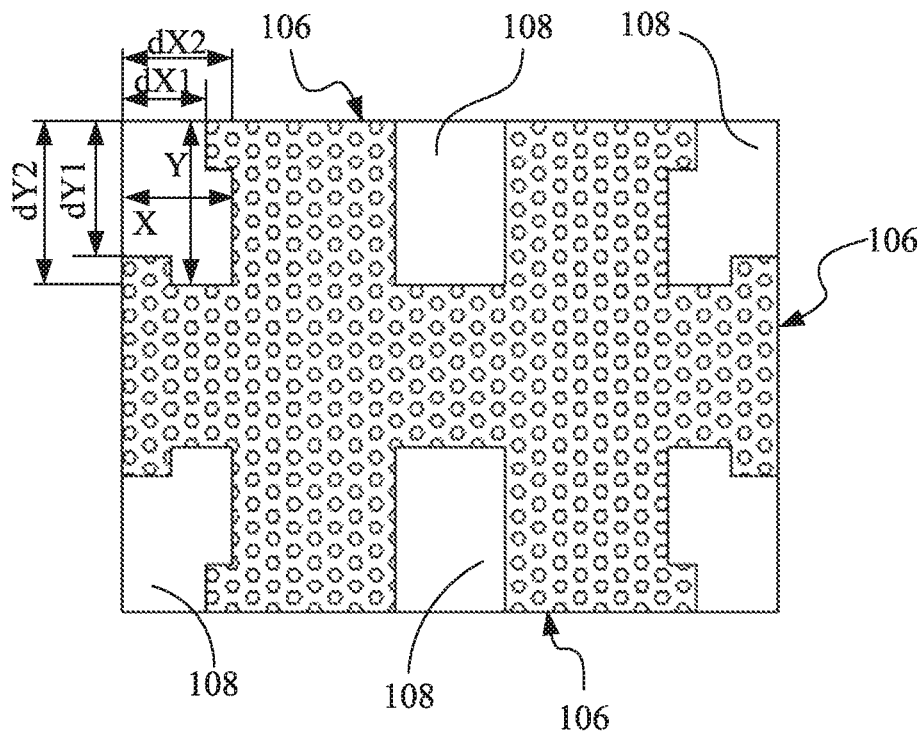

Referring now to the drawings, FIGS. 1A and 1B are side and bottom views of an electronic device 100 according to an embodiment of the present invention. The electronic device 100 has a first surface 102, a second surface 104 and multiple sidewalls 106 between the first and second surfaces 102 and 104. The sidewalls 106 encircle the device. In general, the electronic device typically is rectangular and has four sidewalls 106 that abut the first and second surfaces 102 and 104.

According to one of the embodiment, the electronic device 100 includes multiple contact pads 108 on the first surface 102. The contact pads 108 extend from the surface 102 to the sidewall 106 that abuts the first surface 102. In a preferred embodiment, the contact pads 108 located at the corners of the first surface 102 extend along the two adjacent side walls 106 such that the contact pads 108 on adjoining sidewalls 106 abut each other, thereby covering a corner of the electronic device 100.

Referring to FIG. 1B, the contact pad 108 at the adjoining sidewalls 106 has a first part on an inner part of the first surface 102 and a second part on a peripheral part of the first surface 102, wherein the first part is stepped with respect to the second part. More specifically, in the X-direction, which is parallel with one of the sidewalls 106, a width "dX1" of the contact pad 108 on the peripheral part of the first surface 102 is less than a width "dX2" of the contact pad 108 on the inner part of the first surface 102, such that the contact pad 108 has a stepped profile between the inner part and the peripheral part. Similarly, in the Y-direction, which is parallel with another one of the sidewalls 106, a width "dY1" of the contact pad 108 on the peripheral part of the first surface 102 is less than a width "dY2" of the contact pad 108 on the inner part of the first surface 102, such that the contact pad has a stepped profile between such inner part and the peripheral part.

The contact pads 108 preferably are an electrical connection structure provided by a lead frame that forms the electronic device 100. The lead frame provides signal input/output terminals for a semiconductor die (not shown) of the electronic device 100 to communicate with external circuitry. In the embodiment as shown in FIG. 1, the lead frame of the electronic device 100 provides 6 input/output terminals, wherein on 4 corners of the bottom surface (the first surface 102) of the electronic device 100 there are respectively provided a input/output terminal, while one input/output terminal is provided in a middle position between two of the sidewalls 106. Molding compound is used to sealing the device 100.

Through the above-mentioned stepped contact pads 108, the molding compound between the contact pads 108 is locked to the contact pads 108, so that the electronic device 100 is reliable and robust. One or more of the contact pads 108 can be configured to have the stepped structure.

It will be understood by those of skill in the art that, in other available embodiments, other configurations may be used to provide a mold-lock structure. The stepped structure shown in FIG. 1B can be configured such that the width dX1 (or dY1) on the peripheral part of the first surface 102 is larger than the width dX2 (or dY2) on the inner part of the first surface 102.

Figure 2A:
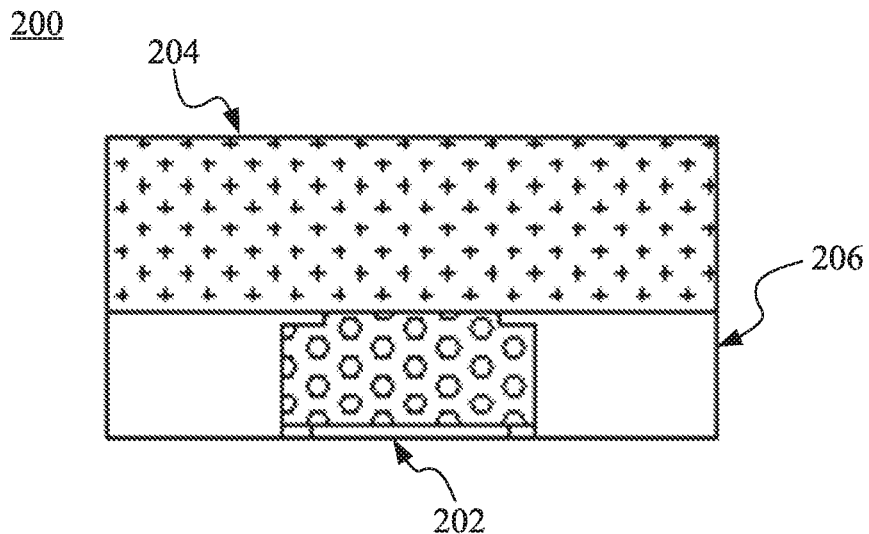
FIGS. 2A and 2B are respectively side view and bottom view of an electronic device according to another embodiment.
Figure 2B:
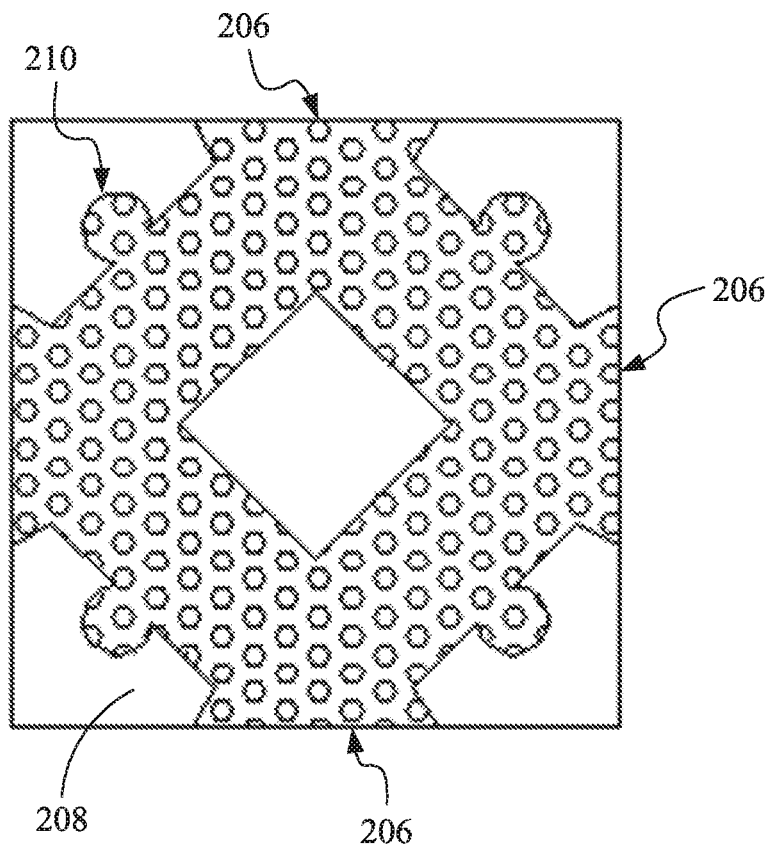

FIGS. 2A and 2B are side and bottom views of an electronic device 200 according to another embodiment of the present invention. Similar to the device 100 of FIGS. 1A and 1B, the device 200 has a first surface 202, a second surface 204 and multiple sidewalls 206 located between and adjoining the first and second surfaces 202 and 204.

The electronic device 200 includes multiple contact pads 208 located on the first surface 202. The contact pads 208 that abut the sidewalls 206 extend from the first surface 202 and also along the adjoining sidewalls 206, such that the contact pads 108 cover a corner of the electronic device 200. Being similar to the embodiment shown in FIGS. 1A and 1B, the size of the contact pad 208 located at an inner part of the first surface 202 is larger than a size of the contact pads at the peripheral part of the first surface 202, such that the contact pads 208 at the sides of the device 200 have a stepped profile between the inner part and the peripheral part of the first surface 202. The stepped profile allows for good mold locking so that the device 200 is mechanically robust.

Furthermore, as shown in FIG. 2B, the contact pad 208 has an arcuate recession 210 at an inner edge thereof. The recession 210 receives molding compound, which provides for additional mold locking and prevents a mismatch between the lead (contact pad 208) and the mold compound caused by uneven mechanical deformation and thermal distortion.

Figure 3A:
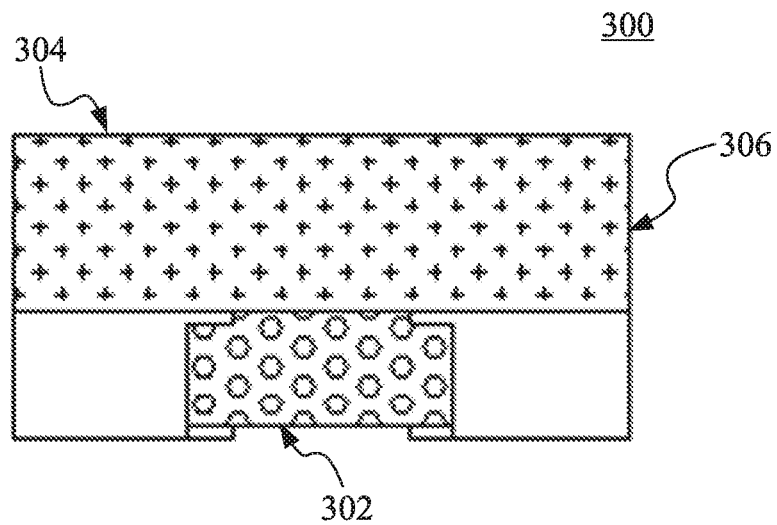
FIGS. 3A and 3B are respectively side view and bottom view of an electronic device according to yet another embodiment.
Figure 3B:
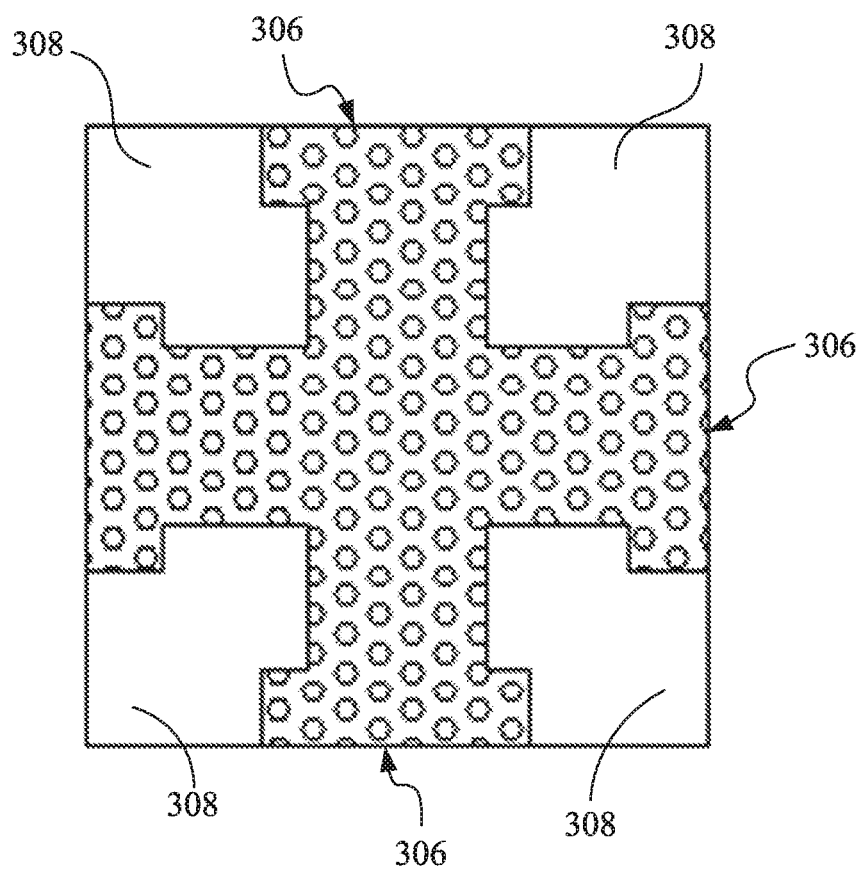

Referring to FIGS. 3A and 3B, an electronic device 300 according to another embodiment of the present invention is shown, which has a structure similar to that of the electronic device 100 (FIGS. 1A-1B). The device 300 has contact pads 308 on a first surface 302 thereof that extend from the first surface 302 to adjoining sidewalls 306 and abut neighboring sidewalls 306, thereby covering the corner of the electronic device 300. Further, the lead frame and the molding material of the electronic device are configured to be locked together through a stepped arrangement of the contact pads 308. That is, the contact pads 308, which are located at the four corners of the device 300, are not simple square or rectangular shape, but have a stepped structure as shown in FIG. 3A.

Figure 4A:
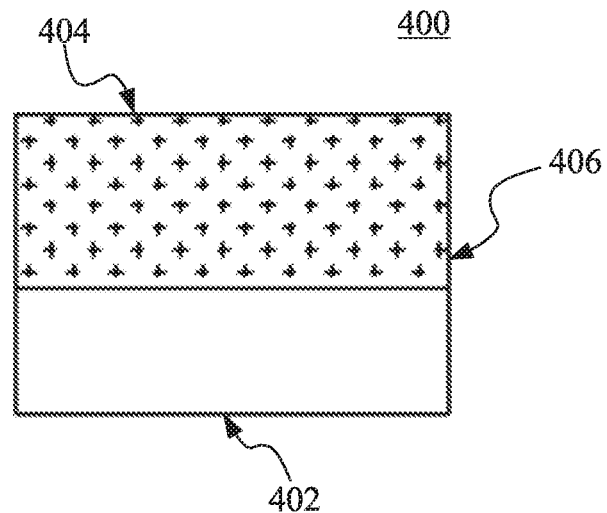
FIGS. 4A and 4B are respectively side view and bottom view of an electronic device according to still another embodiment.
Figure 4B:
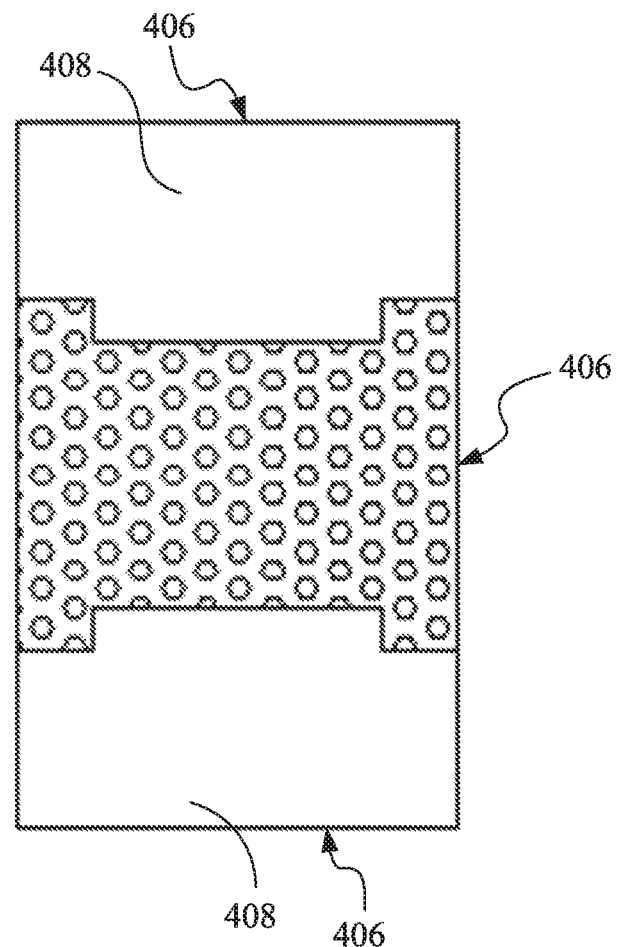

FIGS. 4A and FIG. 4B shown another embodiment of a packaged semiconductor device 400. The device 400 has two contact pads 408 located on opposing ends of a first surface 402. The contact pads 408 extend from the first surface 402 to and partially up the sidewalls 406, and also abut neighboring sidewalls 406, such that the contact pads 408 cover two ends of the electronic device 400. Being different from the embodiments of FIGS. 1A, 2A, and 3A, where contact pads are formed on only two adjacent sidewalls, the electronic device 400 of FIGS. 4A-4B may have contact pads formed on three adjoining sidewalls 406. As shown in FIG. 4B, the electronic device 400 can be configured to include a stepped contact pad structure such as the devices 100, 200 and 300.

Each of the electronic devices 100, 200, 300, and 400 has contact pads that extend from the first surface (e.g., the bottom surface), and abut the sidewalls to form solderable conductive pads on the sidewalls. Compared to the typical QFN package structure, where the soldering connection is only available on the bottom surface, the side-solderable contact pads of the present invention have soldering points exposed when the electronic devices are attached to a PCB. Subsequently, soldering points may be checked using AOI equipment, and the additional side soldering points can provide for enhanced mechanical and electrical connection between the electronic device and the PCB, improving the stability and reliability of the device.

Figure 5A:
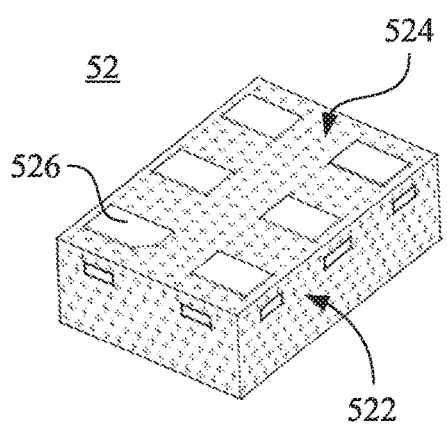
Figure 5B:
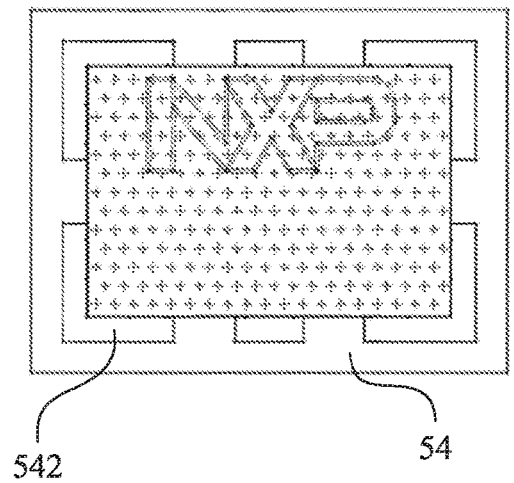
Figure 5C:
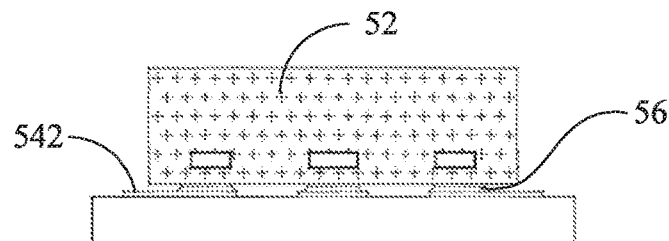
Figure 5D:
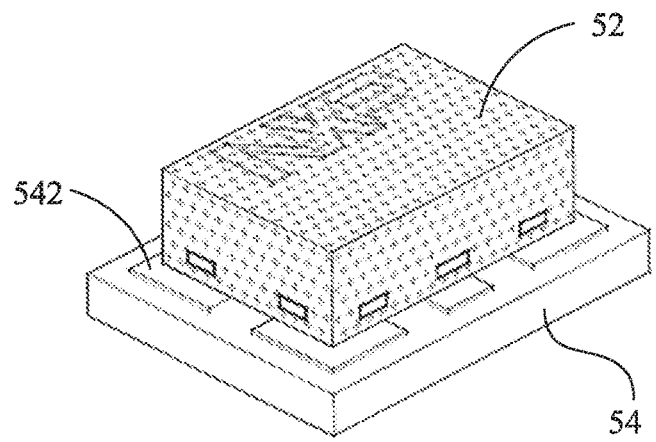

FIGS. 5A-5D illustrate an electronic device 52 connected to external circuitry 54. The electronic device 52 includes a sidewall 522 and a bottom surface 524, and contact pads 526 on the bottom surface 524. The external circuitry 54 may be a PCB or any other form of circuit, and includes soldering pads 542 thereon for connecting with the electronic device 52 in order to input/output signals to the device 52. As shown in FIGS. 5B-5D, there is neither mechanical nor electrical connection between the sidewalls 522 of the electronic device 52 and the external circuitry 54. That is, only the contact pads 526 on the bottom surface 524 of the electronic device 52 are connected to the external circuitry 54 with solder 56. The consequently formed connection does not allow for the connection point features to be captured by AOI equipment in a top-down inspection, so the AOI equipment cannot determine the solder joint reliability.

Referring now to FIGS. 5E-5H, an electronic device 58 in accordance with an embodiment of the present invention includes contact pads 584 on a bottom surface 582. The contact pads 584 are located proximate to the sidewalls 584 and extend onto the sidewalls 586 as shown. Consequently, when the electronic device 58 is connected to external circuitry 54, the contact pads 584 are connected to soldering pads 542 (see FIG. 5D) of the external circuitry 54 not only through a first part on the bottom surface 582, but also through a second part on the sidewalls 584. Thus, this solder joint can be seen from a top view (FIG. 5F) because the solder 56 connects the sidewalls of the electronic device 58 and the soldering pads 542 there-below. The solder 56 is exposed outside the outer profile of the electronic device 58 in such a way that the solder joints can be inspected using AOI equipment.

It will be understood that the electronic devices 52 and 58 shown in FIGS. 5A-5H can be have package forms like DFN or XSON. When compared to general QFN packages, which enable connection only at their bottom surfaces, the electronic device 58 includes the side soldering pad 584 for providing additional mechanical and electrical connection. It is known that, in general reflow processes, both the external circuitry and the electronic device itself will suffer from potential tilt due to the high temperature in the reflow process. Unbalanced tilt may be caused because the electronic device and the external circuitry have additional stress, which may further make the electronic devices inclined or even rosin joint. By including the side contact pads 584 (FIGS. 5E-5H) in addition to the connection on the bottom surface 582 of the electronic device 58, it is possible to bring in the advantage for the electronic device 58 and the external circuit 54 in solving the problem of stress due to tilt, the electronic device 58 is less likely to incline, nor will a rosin joint occur.

Figure 6B:
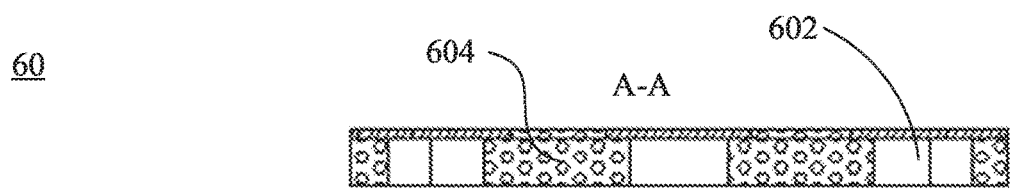
FIG. 6B is a sectional view along A-A direction of FIG. 6A.
Figure 6A:
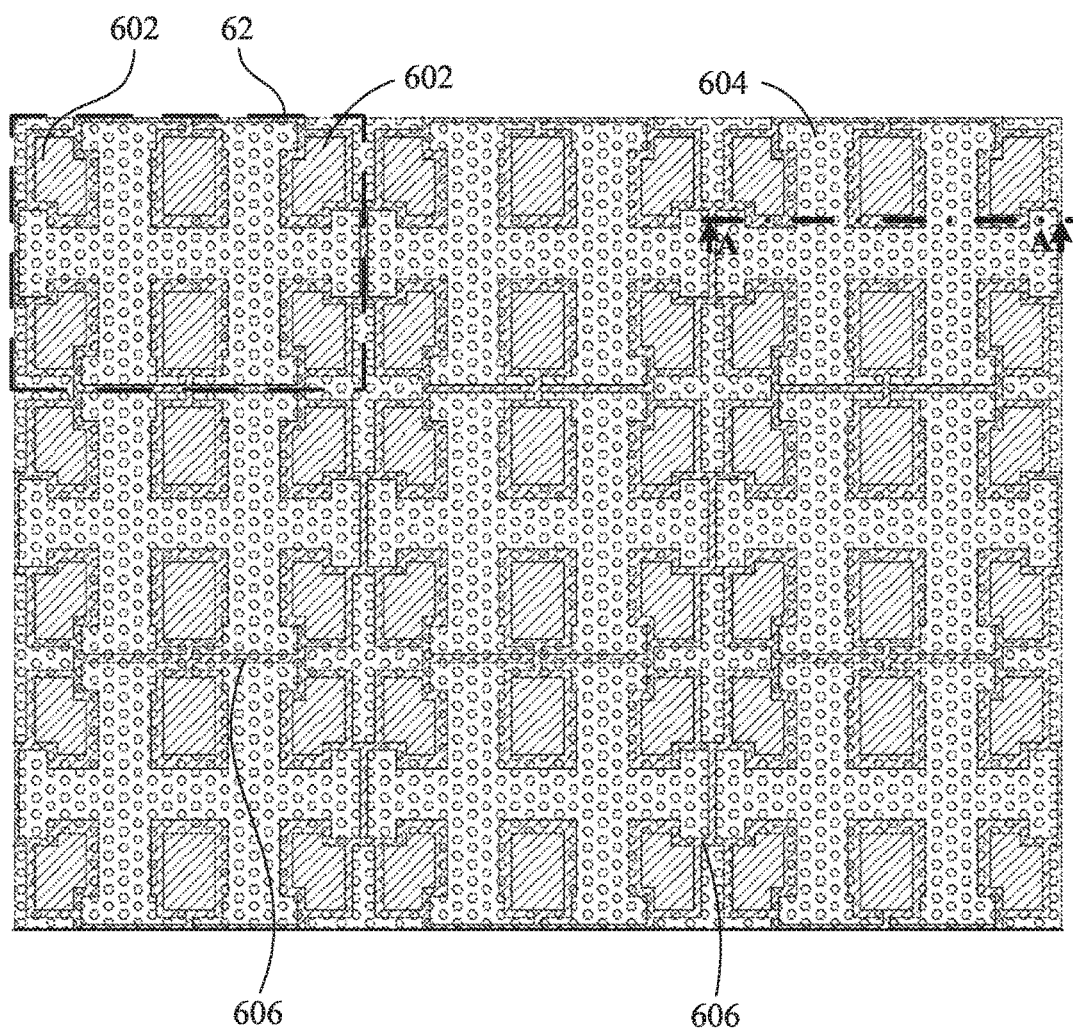
FIG. 6A is a planar view of a lead frame for an electronic device according to an embodiment.

FIGS. 6A is a top view and FIG. 6B is a cross-sectional side view along line A-A of a lead frame 60 for use in an electronic device in accordance with an embodiment of the present invention. The lead frame 60 includes multiple terminal pins 602 arranged in an array and mutually secured with molding compound 604 through a pre-forming arrangement (i.e., a pre-molded lead frame). In the embodiment shown in FIG. 6A, there are six terminal pins 602, all of which are arranged as one sub-frame 62. The lead frame 60 has multiple sub-frames 62. That is, the lead frame 60 comprises an array of sub-frames 62. In other optional embodiments, the lead frame can include other numbers of sub-frames. Similarly, the sub-frame 62 can include other numbers of terminal pins. Additionally, the terminal pins may collectively form the lead frame in any form other than the sub-frame. Optionally, the sub-frames 62 are interconnected through connection layers 606, so that they are stable when the lead frame 60 is formed.

Figure 6C:
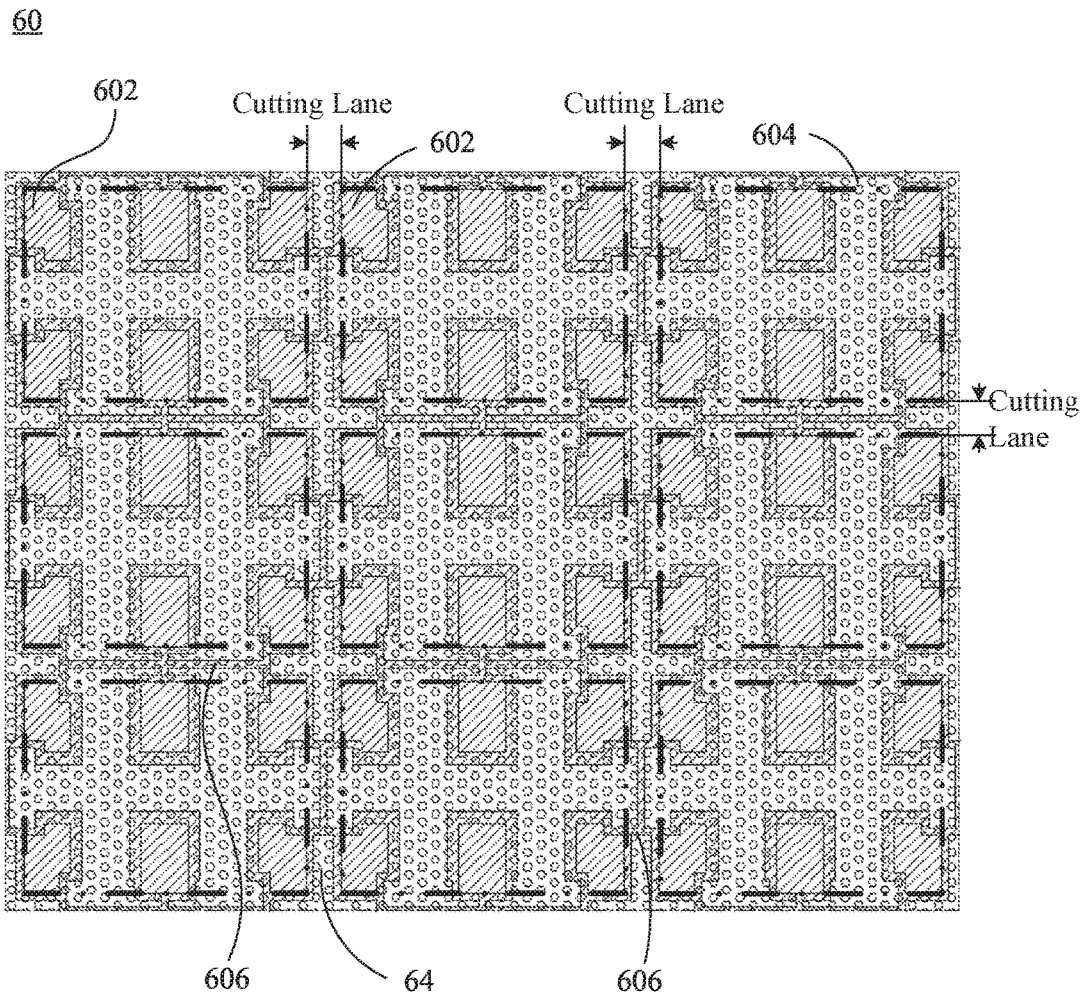
FIG. 6C illustrate the lead frame of the embodiment of FIG. 6A, showing cutting lanes.

With reference to FIG. 6C, which is a top view of a lead frame for an electronic device in accordance with an embodiment, cutting lanes are shown. Generally, each sub-frame 62 in the lead frame 60 corresponds to form a packaged electronic device. However, during formation of the electronic device, it is necessary to separate the sub-frames 62 and the dies attached thereto. Optionally, sawing or laser ablation can be used for the separating. As shown in FIG. 6C, separation of the molded block is conducted along the cutting lanes 64 between sub-frames 62 of the lead frame 60. In the current embodiment, cut the molded block along multiple orthogonal cutting lanes between sub-frames 62 so as to singulate the molded block into multiple electronic devices each with six terminal pins 602. Each cutting lane 64 is along with outer profiles of the terminal pins 602 of each sub-frame 62, such that in the electronic device thereby formed through cutting, a side of the terminal pin 602, which faces the cutting lane 64 is exposed, while any preforming arrangement 604 and connection layer 606 between such sides of the neighboring terminal pins 602 are removed. Consequently, two sides of the terminal pin 602 at a corner where orthogonal cutting lanes 64 crosses are exposed to form the abutting contact pads on the sidewalls of the electronic device as described above.

Figure 7:
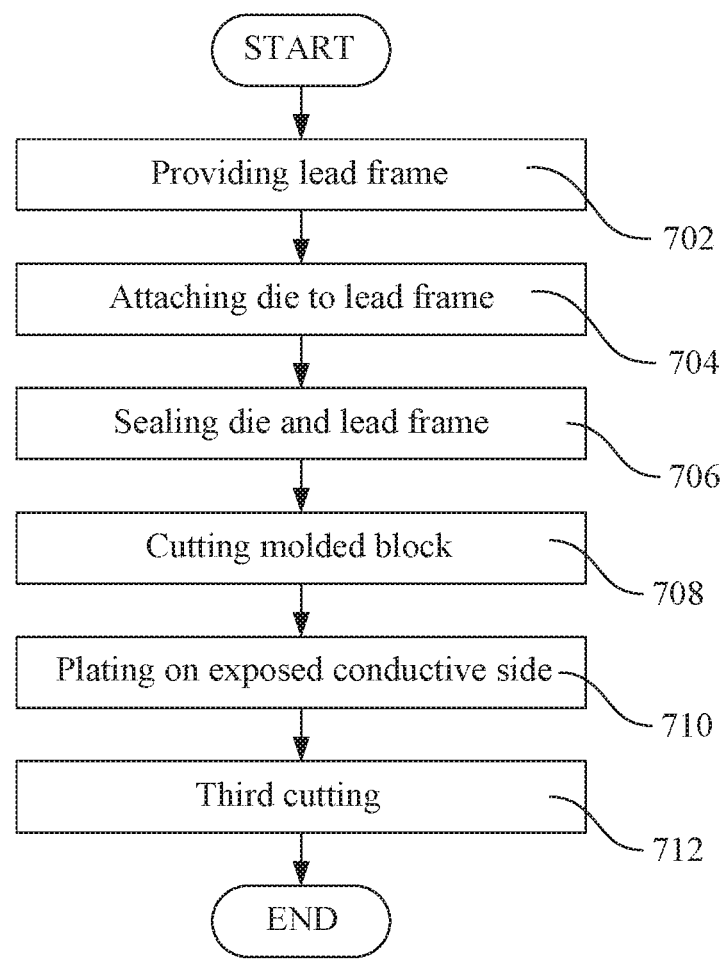
FIG. 7 is a flow chart illustrating a method of making an electronic device in accordance with an embodiment.

FIG. 7 is a flow chart of a method for making the electronic device in accordance with an embodiment. The method is described in detail with reference to side sectional view of the electronic device shown in FIGS. 8A-8E.

Step 702, providing a lead frame. According to one embodiment, the provided lead frame can be the lead frame shown in FIG. 6. It will be understood that the provided lead frame can be other available lead frames selected corresponding to a die to be matched, for making the electronic devices with abutting side-solderable pad on adjoining sidewalls shown in FIGS. 1-4.

Figure 8A:
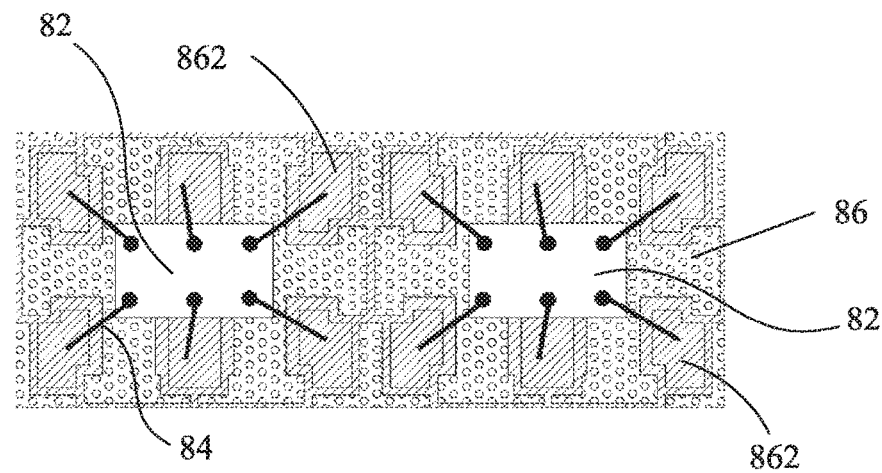
FIGS. 8A-8E are side sectional views in steps of making the electronic device according to an embodiment.

Step 704 provides attaching a die to the lead frame. Known die attach methods may be used for attaching the die to the lead frame, and the die may be face down (e.g., flip-chip) or face-up (for wire bonding). Referring also to FIG. 8A, which shows semiconductor dies 82 are connected to lead frames 86 with bond wires 84. More specifically, bond wires 84 are connected between bonding pads provided on the die 82 and terminal pins 862 of the corresponding lead frame 86.

Figure 8B:
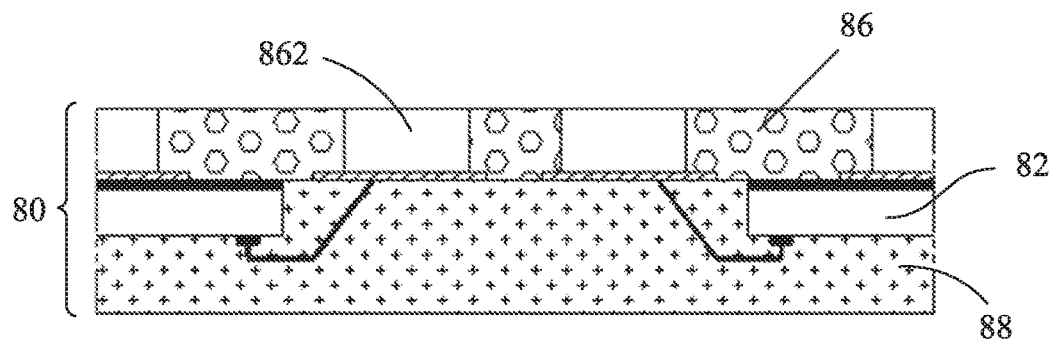

In step 706, the attached die and lead frame are encapsulated with a molding compound. As shown in FIG. 8B, molding material 88 is used for sealing the die and the lead frame to make the molded block 80. Known molding materials used for integrated circuit or electronic component packaging can be used for sealing and molding the assembled die and lead frame.

Figure 8C:
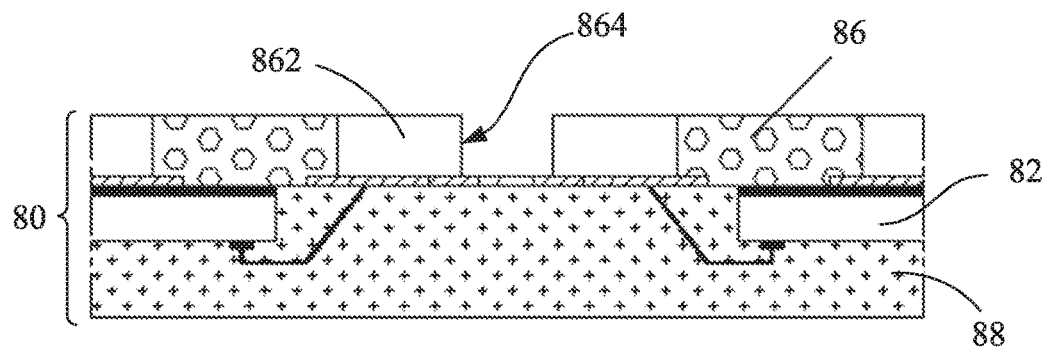

At step 708, a singulation process is performed on the molded block 80 to expose conductive sides of the lead frame. FIG. 8C illustrates cutting the molded block in a direction perpendicular to a plane where the die contacts the lead frame to expose the conductive side 864 of the lead frame. Optionally, any appropriate process (such as laser ablation) in appropriate depth can be used to remove the preforming arrangement extend between sub-frames of the lead frame 86, so that sides of the terminal pins on edges of each sub-frame are exposed. In an optional embodiment, the depth is the thickness of the lead frame 86 in order that the preforming arrangement between the sub-frames of the lead frame 86 can be removed through the cutting in such depth.

The cutting includes a first cut along a first direction and a second cut along a second direction. The first direction is of a predetermined angle with regards to the second direction. As an exemplary embodiment, reference can be made to FIG. 6C where the first cut and the second cut are respectively made along orthogonal cutting lanes, such that terminal pins on edges of the sub-frames expose on both sides and adjoin together.

Figure 8D:
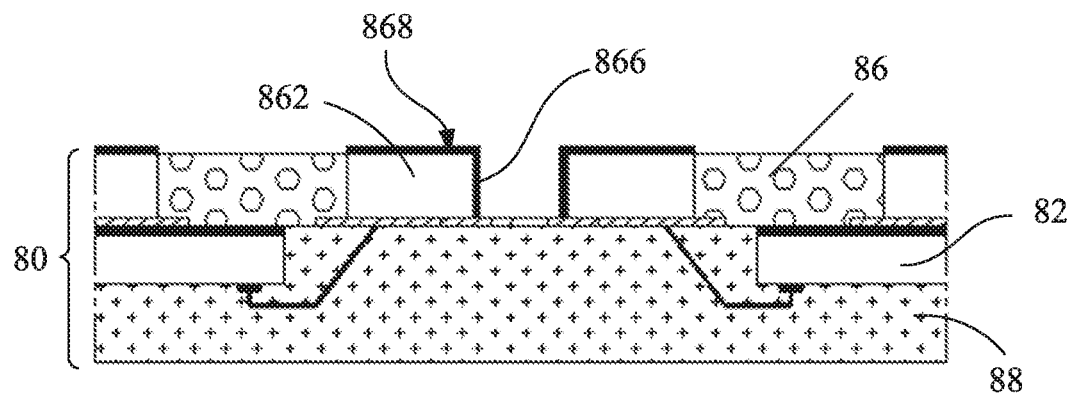

In step 710, plating is applied on the conductive sides exposed through the cutting step 708. With reference to FIG. 8D, plating layer 866 is applied on conductive sides 864. The plating layer 866 is conductive and provide protection to the terminal pins 862 of the lead frame. Optionally, the plating layer 866 is applied to the side 868 of the terminal pin 862 of the lead frame 86 which is opposite to the side where the die 82 is attached. As an example, the plating layer 866 can be applied through electroplating or any other applicable process.

Figure 8E:
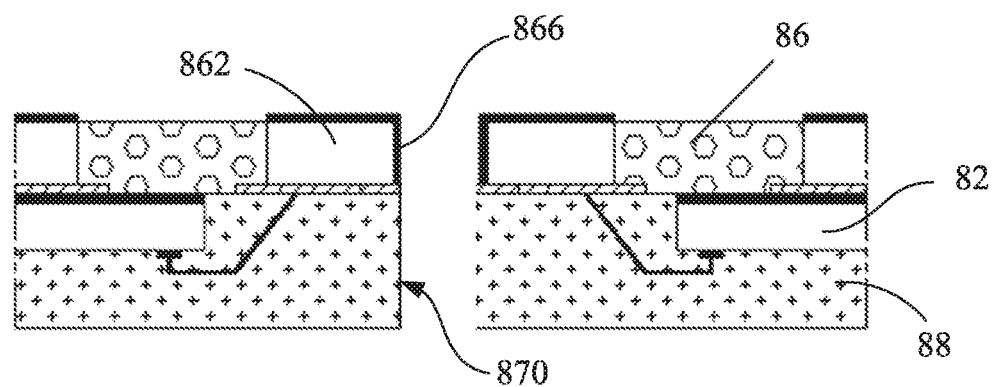

In step 712, the sub-frame and its corresponding die are singulated or separated from the other sub-frames and dies to form the electronic device. As shown in FIG. 8E, a third cut is performed on the molded block 80 through the opening formed by the cutting of step 708. The third cut is performed along the cutting lane shown in FIG. 6C, so that the molding material 88 between dies corresponding to each sub-frame is cut off. The depth and width of the third cut can be different from that of the first and second cuts. Referring to FIG. 8E, if the width of the third cut is different from that of the first and second cuts, the side 870 formed from the third cut will consequently be stepped with regards to the side 864 formed by the first and second cuts on the terminal pins 862. It will be understood that, in other embodiments, the width of the third cut can be the same as that of the first and second cuts. Similarly, the third cut can be performed using known processes like laser ablation.

It can be seen from the electronic device and the method for making the same that, because the contact pads of the electronic device extend from the bottom surface to the sidewalls and abut the sidewalls to form conductive side-contacts, not only are the soldering features enabled to be captured by AOI machine after the electronic device is connected to external circuitry (like PCB), but also electrical and mechanical connections are enhanced such that tilt or rosin joints are less likely to occur. It also should be appreciated that, since the conductive sidewall will be formed through the side of the terminal pins of the lead frame as described above, the electronic device according to the current embodiments can have smaller size yet the same pin pitch, by way of its frameless structure. System integrity is consequently improved. Furthermore, since the metallic conductive side and the soldering point after application is exposed, the thermal performance of the electronic device can be improved, which allows heat generated during operation to dissipate, thus robustness and reliability can be improved.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present invention has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g., "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. An electronic device having:
   a first surface, a second surface opposite to the first surface, and sidewalls adjoining between the first surface and the second surface, the sidewalls being perpendicular to the first surface and second surface;
   wherein the electronic device comprises contact pads located at corners on its first surface, the contact pads extend from the first surface to the adjoining sidewalls, and the contact pads abut each other on the adjoining sidewalls that are perpendicular to the first surface and the second surface,
   wherein the contact pads have a part thereof on an internal part of the first surface that is configured to be stepped with respect to a part of the contact pads on a peripheral part of the first surface.

2. The electronic device as claim 1, further comprising a die within the electronic device, wherein at least part of the contact pads is connected to the die.

3. The electronic device of claim 1, wherein the sidewalls are stair-stepping.

4. The electronic device of claim 3, wherein the first surface has a non-contact pad area that is less than an area of the second surface.

* * * * *